United States Patent [19]

Caesar et al.

[11] Patent Number: 4,990,801
[45] Date of Patent: Feb. 5, 1991

[54] INTERNAL TIMING CIRCUIT FOR A CMOS PROGRAMMABLE LOGIC ARRAY

[75] Inventors: Knut Caesar, Gundelfiugen; Helmut Haeringer, Niederwinden, both of Fed. Rep. of Germany

[73] Assignee: Deutsche ITT Industries GmbH, Freiburg, Fed. Rep. of Germany

[21] Appl. No.: 366,830

[22] Filed: Jun. 15, 1989

[30] Foreign Application Priority Data

Jun. 28, 1988 [EP] European Pat. Off. ........ 88110267.7

[51] Int. Cl.⁵ ............................................ H03K 19/177
[52] U.S. Cl. .................................... 307/469; 307/443; 307/465; 307/481; 307/246
[58] Field of Search ............... 307/443, 451, 452, 465, 307/468–469, 481, 246, 269

[56] References Cited

U.S. PATENT DOCUMENTS

| | | | |
|---|---|---|---|
| 4,675,556 | 6/1987 | Bazes | 307/465 |
| 4,697,105 | 9/1987 | May | 307/465 |
| 4,740,721 | 4/1988 | Chung et al. | 307/469 X |
| 4,760,290 | 7/1988 | Martinez | 307/443 X |
| 4,769,562 | 9/1988 | Ghisio | 307/443 X |
| 4,831,285 | 5/1989 | Gaisen | 307/443 X |
| 4,894,564 | 1/1990 | Sakashita et al. | 307/443 X |

FOREIGN PATENT DOCUMENTS 0178437 9/1985 European Pat. Off. .

OTHER PUBLICATIONS

Patent Abstracts of Japan, Book 10, No. 283 (E-440); and JP-A-61 101 124 (Hitachi Micro Computer Eng Ltd).

N. H. E. Weste et al.; "Principles of CMOS VLSI Design", 1985, Section 372-373; Addison-Wesley Publishign Company, Reading, Mass., U.S.

*Primary Examiner*—David Hudspeth
*Attorney, Agent, or Firm*—Thomas L. Peterson

[57] ABSTRACT

A programmable logic array implemented with complementary insulated-gate field effect transistor technology and formed on a substrate employing a standard AND-OR structure and two non-overlapping clock phases uses diffused capacitors in a dummy row to model the worst case evaluation time of minterms in the AND plane, and a NOR gate, responsive to the dummy row, for enabling the OR plane to sum the minterms generated by the AND plane.

18 Claims, 2 Drawing Sheets

4,990,801

INTERNAL TIMING CIRCUIT FOR A CMOS PROGRAMMABLE LOGIC ARRAY

BACKGROUND OF THE INVENTION

The present invention relates to programmable logic arrays and more particularly to a timing circuit for a non-overlapping, two-phase-clocked programmable logic array implemented with complementary insulated-gate field-effect transistor technology.

A programmable logic array (PLA) provides a regular structure for implementing combinatorial and sequential logic functions. For example, the PLA can be programmed such that a series of inputs can be arranged into sum-of-products expressions, with each output from the PLA corresponding to a different expression. A typical PLA employs a structure including an AND plane, an OR plane, and an AND/OR plane connected therebetween.

The AND plane includes M rows and N columns. Each column corresponds to an input signal and has a pair of column conductor. The first column conductor carries the non-inverted input signal, and the second column conductor carries the inverted input signal. Each row has a pair of transistors and a pair of row conductors. The first row transistor, a p-channel type, forms a controlled current path between the first row conductor and a source of operating potential, thereby serving a "precharge" function; the second transistor, an n-channel type, forms a controlled current path between the second row conductor and a reference potential, thereby serving an "evaluate" function. The gates of the two row transistors are tied together.

The OR plane includes M rows and P columns, wherein each row contains a corresponding row conductor from the AND plane. Each column consists of two column transistors and two column conductors. The first column transistor, a p-channel type, forms a controlled current path between the first column conductor and a source of operating potential, thereby serving a "precharge" function. The second transistor, a n-channel type, forms a controlled current path between the second column conductor and a reference potential, thereby serving an evaluate function. The gates of the two column transistors are tied together. The first column conductors carry the output signals from the OR plane.

The AND/OR plane connects the rows of the AND plane to the rows of the OR plane. For each row, this function is typically implemented by a pair of series-connected inverters which provide for level refreshment of the signal generated by the AND plane.

Realization of a sum of products is achieved by interconnecting the rows and columns of each plane. This "programming" is implemented with n-channel transistors. Products (minterms) are evaluated in the AND plane; each term of the product is realized by connecting the source-drain path of the n-channel transistor between the corresponding first and second row conductors of a given row, and connecting the gate to the appropriate column conductor. The choice of column conductors depends upon whether the inverted (complementary) or non-inverted input signal is desired. The summation of the products is realized in the OR plane where an n-channel transistor connects the first row conductors (each representing a product of terms) with the first column conductor. By connecting the source-drain path of the n-channel transistor between the first and second column conductors of a given column and the gate to the first conductor from a given row, the product from that given row is added to the output for the given column. Thus, the number of n-channel transistors and their respective positions in the AND and OR planes are determined by the desired combinational logic function.

The typical CMOS PLA employs a 2-phase, non-overlap clocking strategy. The first clock phase is used to latch the input signals to the AND plane; the second clock phase is used to transmit output signals from the OR plane.

In addition to the two clock phases, internal timing must be employed in order to allow adequate time for the signals on the row conductors to propagate from the AND plane to the OR plane. This propagation time is referred to as "evaluation" time. Each n-channel transistor exhibits a capacitance that is a function of the area of the source and drain regions. Thus, each n-channel transistor connected to a first row conductor adds a capacitance thereto which delays the propagation time of a signal into the OR plane. If an input signal of every column is used to form a product, there will be one transistor in each column of a given row. In this instance, the longest evaluation time will result when only one row transistor reverses the charge of the line capacitance in response to the input signal. Therefore, the PLA must provide a subcircuit for allowing adequate time for the evaluation of the minterms.

The typical timing circuit of a CMOS PLA employs a dummy row in the AND and AND/OR planes. The dummy row has p-channel and n-channel transistors whose gates are driven by the first clock phase, and two conductors. The source-drain path of the p-channel transistor is connected between a source of operating potential and the first dummy row conductor; the source-drain path of the n-channel transistor is connected between the second dummy row conductor and a reference potential. A pair of n-channel transistors corresponding to each column have their drain-source paths connected between the two dummy row conductors. The gate of one n-channel transistor is coupled to the first column conductor, and the gate of the other n-channel transistor is coupled to the second column conductor.

The AND/OR plane employs a Schmitt trigger having its input coupled to the first dummy row conductor. The output of the Schmitt trigger drives the gates of each pair of column transistors in the OR plane. Thus, by the time the Schmitt trigger snaps on, the minterms on the row conductors have been evaluated.

For a general discussion of programmable logic arrays, see a book entitled "Principles of CMOS VLSI Design" by Neil Weste and Hamran Eshraghian, published by Addison-Wessley Publishing Company, 1985, pp. 368–73. In particular, chapter 8.7.4 describes a typical PLA implemented with CMOS technology using a strict 2-phase clocking strategy. This PLA incorporates transistors in the dummy row and a Schmitt trigger in the AND/OR plane.

Problems in the typical PLA arise from the use of transistors in the dummy row. Because two transistors are employed for each input signal, the load capacitance of that row is twice as great as that for the actual worst-case evaluation time scenario. Clearly, this additional capacitance slows the performance time of the PLA. Furthermore, half the transistors in the dummy row are constantly "on" which consumes power. Other problems in the dummy row relate to the manufacturing process. The CMOS PLAs are made as integrated circuits and therefore exhibit variations in delay due to manufacturing imperfections. Additionally, these transistors take up space on the chip and add to the cost of the circuit.

The Schmitt trigger also provides a source of problems. In addition to the added capacitance of the dummy row, the internal capacitance and hysteresis of the Schmitt trigger adds to the delay of the PLA. Furthermore, the performance of the Schmitt trigger does not preclude malfunctions.

Therefore, it is an object of the present invention to provide a CMOS programmable logic array with a new and improved dummy row.

SUMMARY OF THE INVENTION

In accordance with the teachings of the present invention, a programmable logic array implemented with complementary insulated-gate field effect transistor technology and formed on a substrate employing two non-overlapping clock phases replaces transistors in the dummy row with capacitors having the equivalent capacitances of the drain and source regions, and replaces the Schmitt trigger with a NOR gate.

The preferred embodiment employs a conventional AND-OR structure. The AND plane includes a number (m) of rows and a number (n) of columns. Each row has first and second row conductors, a transistor for precharging that row, and a transistor for evaluating that row with the gates of the respective transistors being driven by the inverted first-phase clock. Each column has first and second column conductors which carry an input signal and an inverted input signal, respectively. A plurality of row transistors are arranged in a number (m) of rows and a number (n) of columns, with the drain-source path of each row transistor being connected between the first and second row conductors, and with the gate being connected to either said first column conductor or said second column conductor. In this manner, logical expressions, more specifically minterms, are realized and evaluated.

In a conventional manner, the OR plane adds the evaluated minterms to a plurality of outputs, thereby forming a different sum of products expression for each output. However, before the OR plane is enabled, it must allow for the minterms to be evaluated.

A dummy row connected to the AND and the AND/OR planes is used for internal timing; it models the longest evaluation time for the AND plane whereupon it enables the OR plane. The dummy row includes first and second dummy row conductors, a NOR gate, a transistor for precharging the dummy row a transistor for evaluating the dummy row, and a series of capacitors connected to the row conductors. The precharge/evaluate transistors apply a signal to the first row conductor during the inverted first clock phase. The capacitance on the line delays the propagation of the signal thereon, thereby modeling the worst time delay for any of the rows in the AND plane. The delayed signal triggers the NOR gate which enables the OR plane to add the evaluated minterms. Thus, in order to model a worst delay time scenario, there must be at least twice as many capacitors as the number of row transistors in the row of the AND plane having the most row transistors. One half of the capacitors are connected between the first dummy row conductor and the reference potential, and the other half is connected between the second row conductor and the reference potential. Each capacitor has roughly the same capacitance length as a row transistor whose source-drain path is connected between the first and second row conductors. The maximum number of capacitors are twice the number (n) of rows.

In an alternate embodiment of the AND plane, for every pair of rows, including the dummy row, the second row conductors are combined into a common conductor. Accordingly, the two evaluate transistors are replaced with a single evaluate transistor. Capacitance on the dummy row conductor is also increased to match the capacitances on each of the row conductors. In this embodiment, there must be three times as many capacitors as the number of row transistors in the row having the greatest number of row transistors.

DETAILED DESCRIPTION OF THE FIGURES

Figure 1:
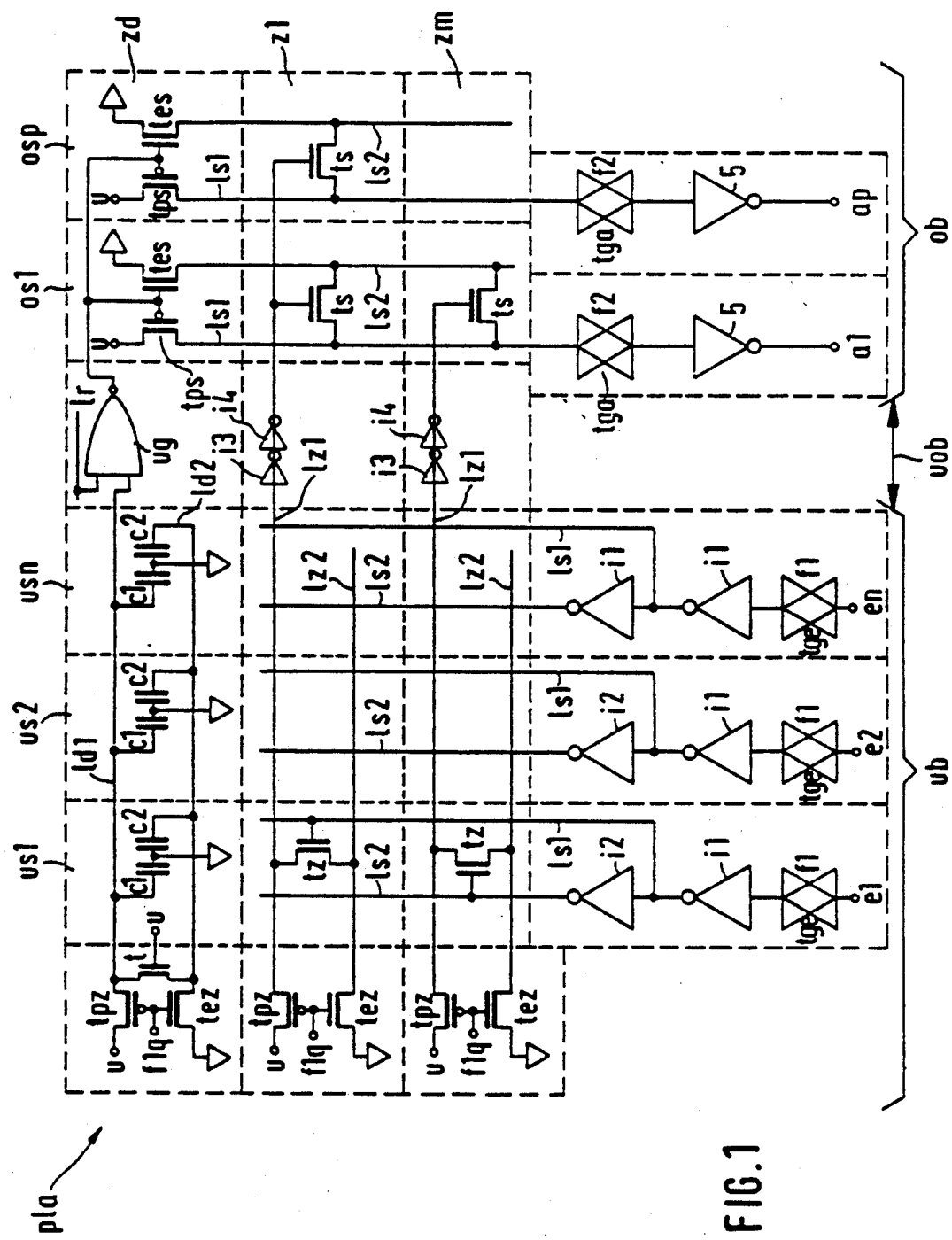
FIG. 1 is a schematic diagram of a first embodiment of a programmable logic array constructed in accordance with the present invention.

Referring to FIG. 1, there is shown a schematic diagram of a programmable logic array pla having n inputs and p outputs. All transistors employed in the programmable logic array pla are complementary insulated-gate field-effect transistors.

The programmable logic array pla includes an AND plane ub, an OR plane ob, and an AND/OR plane uob connected therebetween. The AND plane ub includes m rows z1-zm and n columns us1-usn. Each column us1-usn is provided with an input signal on a corresponding conductor e1-en. When an input signal is applied to a conductor e1-en for a given column, the signal passes through a transmission gate tge, to be described hereinafter, and then undergoes a two-stage inversion to refresh the level of the input signal. Inverter i1 performs the first stage of inversion, and inverter i2 connected in series therewith performs the second stage of inversion. The output of inverter i1 is coupled to a first column conductor ls1. Thus, the first column conductor ls1 provides the inverted input signal. The output of inverter i2 is coupled to the second column conductor ls2. Thus, the second column conductor ls2 provides the non-inverted input signal. Therefore, it can be seen that each column us1-usn contains first and second column conductors ls1 and ls2.

Each row z1-zm in the AND plane ub includes a pair of transistors tpz and tez for precharging and evaluating the row, and a pair of row conductors lz1 and lz2. The precharge transistor tpz is a p-channel type with its drain-source path connecting between the first row conductor lz1 and a source of operating potential (u); the evaluate transistor is an n-channel type with its drain-source path connecting between the second row conductor lz2 and a reference potential. The gates of the two transistors tpz and tez are tied together.

Minterms (products) are realized by connecting the row conductors lz1 and lz2 to a column conductor ls1 or ls2 of a given input signal. As a result, each row that is connected to a column conductor supplies a minterm on its first row conductor lz1. This "programming" is implemented with n-channel transistors tz. The various connections to a given row constitutes a minterm. The source-drain path of transistor tz is connected between the corresponding first and second row conductors lz1 and lz2, and the gate is connected to the appropriate column conductor ls1 or ls2. The choice of column conductors depends upon whether the inverted (complementary) or non-inverted input signal is desired. Thus for the programmable logic array pla illustrated in FIG. 1, the first row z1 of the AND plane ub supplies the minterm e1', while the mth row zm supplies the minterm e1. In light of the foregoing detailed description, the AND plane ub is a conventional PLA structure that is familiar to those skilled in the art.

The OR plane ob includes a matrix having m rows z1-zm and p columns os1-osp. Each row z1-zm contains a first row conductor lz1 from the corresponding row in the AND plane ub. Thus, conductor lz1 from the first row z1 supplies in the AND plane its minterm to the first row z1 of the OR plane.

The OR plane ob also has a row zd. This row zd contains a pair of transistors tps and tes, and a pair of column conductors ls1 and ls2 for each column os1-osp in the OR plane ob. The gates of the two transistors tpz and tez are tied together and are driven by an internal timing subcircuit which will be described in detail hereinafter. Transistor tps, which precharges the column is a p-channel transistor having its drain-source path connecting between the first column conductor ls1 and a source of operating potential (u). Transistor tes, which evaluates the column is an n-channel transistor having its drain-source path connecting between the second row conductor ls2 and a reference potential. Each first column conductor ls1 terminates into an output conductor a1-ap.

Each minterm is added to an output a1-ap by connecting the first row conductors lz of its associated row to column conductors ls1 and ls2. This "programming" is implemented with n-channel transistors ts. The source-drain path of transistor ts is connected between the corresponding first and second column conductors ls1 and ls2, and the gate is connected to the appropriate first row conductor lz1 of the selected row. Thus for the programmable logic array pla illustrated in FIG. 1, the first output contains the expression e1+e1', while the mth output conductor and provides the expression e1'. In light of the foregoing detailed description, the OR plane ob is a conventional PLA structure that is familiar to those skilled in the art.

The AND/OR plane uob connects the rows of the AND plane ub to the rows of the OR plane ob to facilitate the transfer of signals therebetween. In the preferred embodiment, this function is accomplished by two inverters i3 and i4 connected in series to refresh the signal level. Thus, the pair of series-connected inverters i3 and i4 connects the first row conductor lz1 for each row z1-zm between the AND and OR planes ub and ob.

The programmable logic array illustrated in FIG. 1 employs a 2-phase, non-overlap clocking strategy. The complement of the first clock phase f1q drives the precharge/evaluate functions in the AND plane. The first clock phase f1 controls the transmission of the input signals to the AND plane ub through device tge. Note that one device tge corresponds to each input conductor e1-en. Device tge can be a transmission gate or a latch for storing the input signal. Such devices are well known to those skilled in the art.

The output signal provided on each of the first column conductors ls1 is controlled by the second clock phase f2, passed through a second transmission gate fga and inverted by a fifth inverter i5. The resulting outputs are provided on conductors a1-ap.

It has been noted that each transistor tz exhibits capacitance through the drain-source path. Thus, by connecting transistor tz to a row conductor lz1 in the AND plane in order to add a term to the a minterm, the capacitance on that row conductor increases, thereby delaying the propagation of the signal thereon. Therefore, the programmable logic array must employ an internal timing subcircuit in order to allow the signals on the first row conductors lz1 to propagate from the AND plane to the OR plane.

The internal timing subcircuit includes a dummy row zd that is added to rows z1-zm of the AND plane ub, and a dummy row zd that is added to the AND/OR plane uob. The dummy row zd in the AND plane ub includes a pair of transistors tpz and tez for precharging and evaluating the row zd, and a pair of row conductors ld1 and ld2. The precharge transistor tpz is a p-channel type with its drain-source path connected between the first row conductor ld1 and a source of operating potential (u); the evaluate transistor is an n-channel type with its drain-source path connected between the second row conductor ld2 and the reference potential. The gates of the two transistors tpz and tez are tied together and are driven by the first clock phase f1.

The dummy row zd of the AND plane ub contains two capacitors c1 and c2 per column. The first capacitor is connected between the first dummy row conductor ld1 and ground, and the second capacitor is connected between the second dummy row conductor ld2 and ground. The capacitors c1 and c2 are grounded through the substrate. Thus the dummy row zd having n columns contains 2n capacitors in the preferred embodiment. In an alternate embodiment, the dummy row zd may contain fewer than 2n capacitors; however, the number must be at least twice that of the row having the greatest number of transistors tz (the greatest number of terms in a minterm). Each capacitor c1 and c2 models the capacitance, and thus the delay time of the transistor tz to which it corresponds. Thus for a given column, the two capacitor c1 and c2 should have the same area and the same edge length as the source region and drain regions respectively of the transistor tz. Therefore, the capacitance on the dummy conductors ld1 and ld2 are at least as great as the capacitance on any of the first row conductors.

The dummy row zd of the AND plane ub also contains an n-channel transistor t that lies outside the AND plane ub. The source-drain path of transistor t is connected between the first and second dummy row conductors ld1 and ld2. The gate of transistor t is connected to the source of operating potential (u). The transistor t has the same layout as the transistors tz.

The first dummy row conductor ld1 is coupled to one input of a NOR gate ug which is located in the dummy row zd of the AND/OR plane uob. The other input of the NOR gate ug is coupled to a reset conductor lr.

The programmable logic array pla is fabricated as a monolithic integrated circuit. Transistors tez, tpz, tps, tes, tz and ts, inverters i1-i5, transmission gates tge and tga, and NOR gate ug are fabricated through a CMOS process that is well known to those skilled in the art. The capacitors c1 and c2 are formed within regions which are doped oppositely to the substrate (see region d in FIG. 2). The row conductors lz1 and lz2 are made of aluminum; the column conductors ls1 and ls2 are preferably made from polycrystalline silicon.

Figure 2:
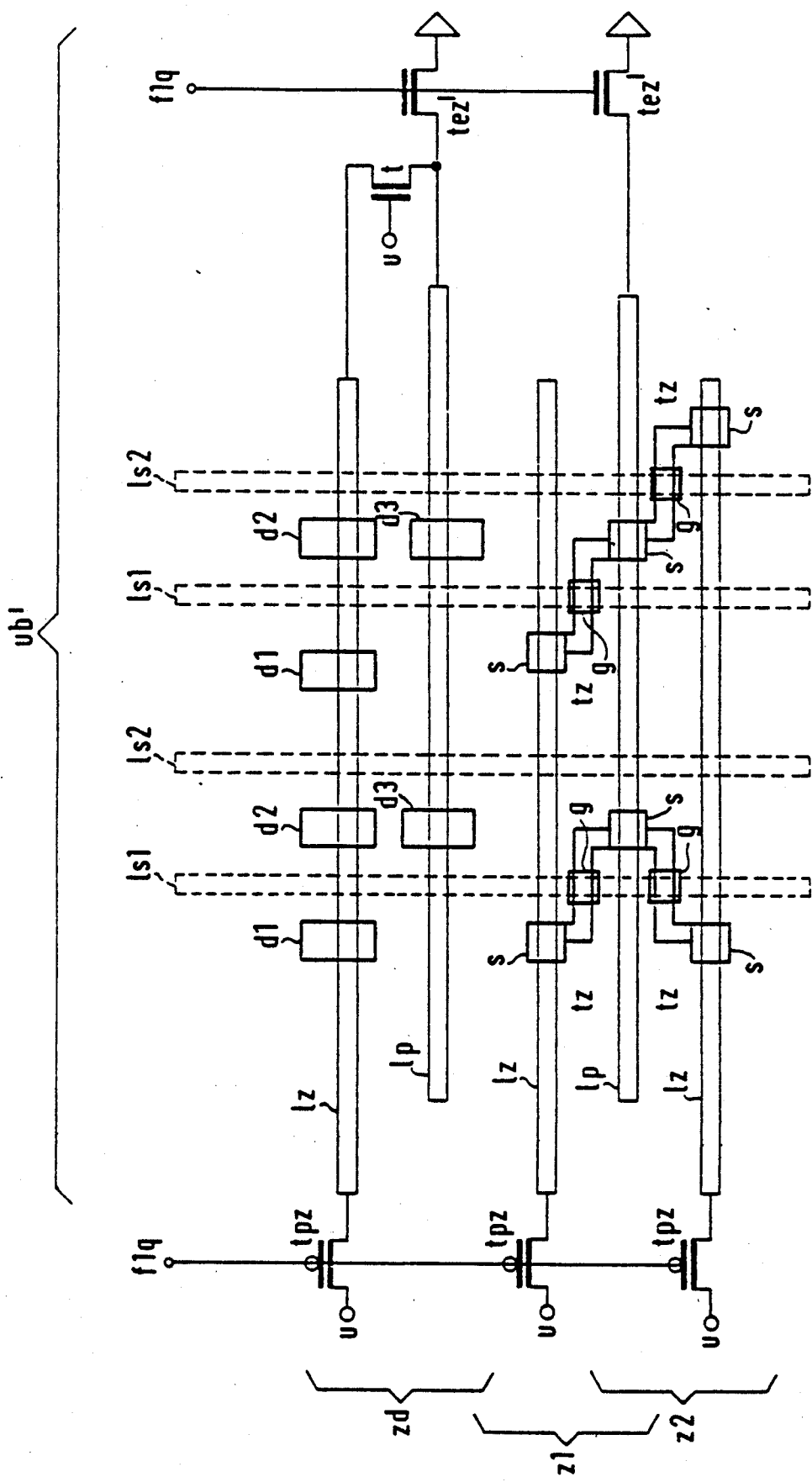
FIG. 2 is a schematic diagram of a second embodiment of an AND plane for a programmable logic array constructed in accordance with the present invention.

Referring now to FIG. 2, there is shown a second embodiment of an AND plane ub' constructed in accordance with the present invention. The OR and AND-/OR planes in the second embodiment are identical to those employed in programming logic array pla illustrated in FIG. 1. Thus, only the AND plane ub' illustrated in FIG. 2 is described in the following paragraphs.

The second embodiment of the AND plane ub' combines the second row conductor lz2 (see FIG. 1) of every pair of rows z1-zm, including the dummy row zd, thereby forming common conductors lp. Accordingly, every two evaluate transistors tez (see FIG. 1) are replaced with a single evaluate transistor tez'. Thus, the AND plane ub' includes a array having n columns us1-usn, m rows z1-zm, and a dummy row zd. Each column us1-usn has first and second column conductors ls1 and ls2. Conductor ls1 carries the inverted input signal; conductor ls2 carries the non-inverted signal.

Each row z1-zm and zd in the AND plane ub' includes a transistor tpz for precharging the row and a first row conductor lz. The precharge transistor tpz is a p-channel type with its drain-source path connecting between the first row conductor lz and a source of operating potential (u). The gates of the precharge transistors are driven by the inverted first clock phase f1q. Every pair of rows shares a common row conductor lp and an evaluate transistor tez'. The evaluate transistor is an n-channel type with its drain-source path connected between the common row conductor lp and ground. The gates of transistors tpz are driven by the inverted first clock phase f1q.

Transistors tz are connected between the first and common row conductors lz and lp. For example, FIG. 2 depicts two transistors tz connected between the common row conductor lp and the first row conductor for row z1, and two transistors tz connected between the common row conductor lp and the first row conductor for row z2. Areas designated s represent the locations where the source or drain terminals of the row transistors tz connect to the row lines lz and lp. Areas designated g represent the locations where the gates of the row transistors tz connect to the column lines ls1 and ls2. The dummy row zd of the AND plane ub also contains an n-channel transistor t that lies outside the AND plane ub. The source-drain path of transistor t is connected between the first and common row conductors lz and lp. The gate of transistor t is connected to the source of operating potential (u). The row conductors lz and lp are made of aluminum, and the column conductors ls1 and ls2 are preferably made from a polycrystalline silicon.

To model the worst time delay of the AND plane ub', three capacitors in the regions designated d are employed for every column in which a row transistor tz is connected. Thus, the maximum number of transistors used is three times the number (n) of columns. Two-thirds of the capacitors in regions d1 and d2 are connected between the row conductor lz and the reference potential, while the remaining third of the capacitors in regions d3 are connected between the common row conductor lp and ground. These regions are doped oppositely to the substrate and have, as far as possible, the same area and the same edge length as the regions of the associated row transistors tz.

Although the present invention has been described in connection with two highly specific exemplary embodiments thereof, it will be understood that many variations and modifications can be made by those of ordinary skill in the art. Therefore, it is manifestly intended that this invention be only limited by the claims and the equivalents thereof.

We claim:

1. A programmable logic array employing non-overlapping first and second clock phases and comprising:
   AND plane means for realizing a plurality of minterms, said AND plane means receiving a plurality of input signals during the first clock phase and evaluating said minterms with said input signals during the inverted first clock phase, an output signal being provided for each one of said evaluated minterms, said AND plane means having internal capacitances which correspond to said minterms and which delay the time required to evaluate said minterms;
   a delay row having first and second dummy row conductors, timing signal means for applying a timing signal during the inverted first clock phase to the input of said first dummy row conductor, and a plurality of capacitors consisting of a first group and a second group, said first group of capacitors being connected between said first dummy row conductor and a reference potential, said second group of capacitors being connected between said second dummy row conductor and the reference potential, the capacitance of said plurality of capacitors being selected to delay the output of said timing signal on said first dummy row conductor for a time at least as long as the time required to evaluate said plurality of minterms;
   gate means, responsive to the output of said first dummy row conductor, for generating an enabling signal; and
   OR plane means, responsive to said enabling signal generated by said gate means, for selectively adding the output signals provided by said AND plane means to any number of a plurality of output conductors, the signals on said output conductors being output during the second clock phase.

2. A programmable logic array according to claim 1, wherein said transistors are complementary insulated-gate field effect transistors.

3. A programmable logic array according to claim 1, wherein said gate means includes a NOR gate.

4. A programmable logic array according to claim 1, wherein said AND plane means includes:
   M rows and N columns where M and N are positive integers, each one of said M rows corresponding to a minterm and having first and second row conductors, and each one of said N columns receiving one of said plurality of input signals and having first and second column conductors, the non-inverted and inverted input signals being applied to said first and second column conductors, respectively;
   a plurality of first n-channel transistors having gates and drain-source paths, wherein a minterm is realized by connecting the drain-source path of each first n-channel transistor between said first and said second row conductors of the row corresponding to the minterm, and by connecting the gate to either said first column conductor or said second column conductor of one of said N columns; and row means for evaluating and precharging a corresponding one of said M rows of said AND plane means, said row means providing a signal on said first row conductor during the inverted first clock phase, wherein said signal propagates down said first row conductor to provide the output signal.

5. A programmable logic array according to claim 4, wherein said OR plane means includes:

M rows and P columns where P is also a positive integer, each one of said P columns having first and second column conductors, said first column conductor being said output conductor, said first row conductor in each one of said M rows of said AND plane means extending into the corresponding one of said M rows of said OR plane;

a plurality of second n-channel transistors having gates and drain-source paths, wherein a minterm is added to a column by connecting the drain-source path of each second n-channel transistor between said first and second column conductors of said column, and by connecting the gate to a first row conductor of the row corresponding to the minterm; and column means for evaluating and precharging a corresponding one of said P columns, said column means providing a signal on said first column conductor, responsive to the enabling signal issued by said gate means.

6. A programmable logic array according to claim 5, wherein said row means for said corresponding row includes a first p-channel transistor having its controlled current path connected between said first row conductor and a source of operating potential, and a third n-channel transistor having its controlled current path connected between said second row conductor and a reference potential, the respective gates of said first p-channel and third n-channel transistors being driven by the inverted first clock phase, and wherein said column means for said corresponding column includes a second p-channel transistor having its controlled current path connected between said first column conductor and a source of operating potential, and a fourth n-channel transistor having its controlled current path connected between said second row conductor and a reference potential, the respective gates of said second p-channel and fourth n-channel transistors being driven by said enabling signal issued by said gate means.

7. A programmable logic array according to claim 6, wherein said timing signal means includes a third p-channel transistor having its drain-source path connected between said first dummy row conductor and a source of operating potential, and a fifth n-channel transistor having its drain-source path connected between said second dummy row conductor and a reference potential, wherein the gates of said third p-channel and fifth n-channel transistors are driven by the inverted first clock phase and wherein said plurality of capacitors is equal to at least twice the number of first n-channel transistors in the row having the greatest number of first n-channel transistors, with said first group being half of said plurality of capacitors, and with said second group being the other half of said plurality of capacitors.

8. A programmable logic array according to claim 7, wherein each of said capacitors has the same capacitance as those first n-channel transistors whose source-drain paths are connected between the first and second row conductors.

9. A programmable logic array according to claim 7, wherein the maximum number of said plurality of capacitors employed is twice that of the number of columns N.

10. A programmable logic array according to claim 1, wherein said AND plane means includes:

M rows and N columns where M and N are positive integers, each row corresponding to a minterm and having a first row conductor, each pair of rows having a common row conductor, and each one of said N columns receiving one of said plurality of input signals and having first and second column conductors, the non-inverted and inverted input signals being applied to said first and second column conductors, respectively;

a plurality of first n-channel transistors, wherein a minterm is realized by connecting the drain-source path of said first n-channel transistor between said first and said common row conductors of the row corresponding to the minterm, and by connecting the gate to either said first column conductor or said second column conductor of one of said N columns; and row means for evaluating and precharging a corresponding one of said M rows of said AND plane means, said row means providing a signal on said first row conductor responsive to the inverted first clock phase, wherein said signal propagates down said first row conductor to provide the output signal.

11. A programmable logic array according to claim 10, wherein said OR plane means includes:

M rows and P columns where P is also a positive integer, each one of said P columns having first and second column conductors, said first column conductor being said output conductor, said first row conductor in each one of said M rows of said AND plane means extending into the corresponding one of said M rows of said OR plane;

a plurality of second n-channel transistors having gates and drain-source paths, wherein a minterm is added to a column by connecting the drain-source path of each second n-channel transistor between said first and second column conductors of said column, and by connecting the gate to a first row conductor of the row corresponding to the minterm; and column means for evaluating and precharging a corresponding one of said P columns, said column means providing a signal on said first column conductor, responsive to the enabling signal issued by said gate means.

12. A programmable logic array according to claim 11, wherein said column means for said corresponding column includes a first p-channel transistor and a third n-channel transistor, the controlled current path of said first p-channel transistor being connected between said first column conductor and a source of operating potential, the controlled current path of said third n-channel transistor being connected between said second column conductor and the reference potential, the respective gates of said first p-channel and third n-channel transistors being driven by said enabling signal issued by said gate means.

13. A programmable logic array according to claim 12, wherein said row means for said corresponding row includes a second p-channel transistor for precharging said corresponding row, the controlled current path of said second p-channel transistor being connected between said first row conductor and a source of operating potential, and a fourth n-channel transistor for evaluating a pair of rows, the controlled current path of said fourth n-channel transistor being connected between said common row conductor, the respective gates of said second p-channel and fourth n-channel transistors being driven by the inverted first clock phase.

14. A programmable logic array according to claim 13, wherein said second dummy row conductor is a common row conductor, wherein said timing signal means includes a third p-channel transistor having its drain-source path connected between said first dummy row conductor and a source of operating potential, and a fifth n-channel transistor having its drain-source path connected between said second dummy row conductor and a reference potential, wherein the gates of said third p-channel and fifth n-channel transistors are driven by the inverted first clock phase and wherein said plurality of capacitors is equal to at least three times the number of first n-channel transistors in the row having the greatest number of first n-channel transistors, with said first group being two thirds of said plurality of capacitors and with said second group being the other third of said plurality of capacitors.

15. A programmable logic array according to claim 14, wherein each of said capacitors has the same capacitance as those first n-channel transistors whose source-drain paths are connected between the first and common row conductors.

16. A programmable logic array according to claim 15, wherein the maximum number of said capacitors is three times the number N of columns in said AND plane means.

17. A programmable logic array, implemented with complementary insulated-gate field effect transistor technology and formed on a substrate employing two non-overlapping clock phases and comprising:

AND plane means for realizing a plurality of minterms including M rows and N columns where M and N are positive integers, each one of said M rows corresponding to a minterm and having first and second row conductors, a first transistor having its controlled current path connected between said first row conductor and a source of operating potential, and a second transistor having its controlled current path connected between said second row conductor and a reference potential, the gates of said first and second transistors being driven by the inverted first clock phase, and each one of said N columns receiving one of a plurality of input signals and having first and second column conductors, the non-inverted and inverted input signals being applied to said first and second column conductors, respectively, said AND plane means also including a plurality of third transistors, wherein a minterm is realized by connecting the controlled current path of said third transistor between said first row conductor and second row conductors of the row corresponding to the minterm and having its gate connected to either said first column conductor or said second column conductor of one of said N columns;

OR plane means for summing the minterms and having M rows and P columns where P is also a positive integer, said first row conductor of each one of said M rows in said AND plane means extending into a corresponding one of said M rows of said OR plane means, each one of said N columns having first and second column conductors, said first column conductor providing an output signal corresponding to a sum of minterms, a fourth transistor having its controlled current path connected between said first column conductor and a source of operating potential, and a fifth transistor having its controlled current path connected between said second column conductor and the reference potential, said OR plane means also having a plurality of sixth transistors, wherein a minterm is added to a column by connecting the controlled current path of said sixth transistors between said first and second column conductors of said column, and having its gate connected to a row conductor of a corresponding minterm;

AND/OR plane means for connecting said AND plane means to said OR plane means; and a delay row connected to said AND and said AND/OR planes for generating a timing signal to enable said OR plane means, including:

first and second dummy row conductors;

a NOR gate having one input connected to said first dummy row conductor, another input connected to a conductor having a reset signal applied thereto, and the output coupled to the respective gates of the fourth and fifth transistors in each one of said P columns in said OR plane means;

a seventh transistor having its controlled current path connected between said first dummy row conductor and a source of operating potential, and with the controlled current path of said eighth transistor being connected between said second dummy row conductor and the reference potential, the respective gates of said seventh and eighth transistors being driven by the inverted first clock phase;

a number of capacitance regions formed on the substrate and doped opposite thereto being at least twice as great as the number of third transistors in that row of the AND plane having the most third transistors, one half of said capacitance regions being in contact with said first dummy row conductor and the other half of said capacitance regions being in contact with said second dummy row conductor, each of said capacitance regions having the same capacitance as those third transistors whose controlled current paths are connected between the first and second row conductors, the maximum number of said capacitance regions being twice the number of rows N in said AND plane means; and an n-channel transistor lying outside of said AND plane, having its drain-source path connected between said first and second dummy row conductors, and the gate of said n-channel transistor being connected to a source of operating potential.

18. A programmable logic array, implemented with complementary insulated-gate field effect transistor technology and formed on a substrate employing two non-overlapping clock phases and comprising:

AND plane means for realizing a plurality of minterms including M rows and N columns where M and N are positive integers, each one of said M rows corresponding to a minterm and having a first row conductor and a first transistor having its controlled current path connected between said first row conductor and a source of operating potential, each pair of rows having a common row conductor and a second transistor having its controlled current path connected between said common row conductor and a reference potential, the gates of said first and second transistors being driven by the inverted first clock phase, and each one of said N columns receiving one of a plurality of input signals and having first and second column conductors, the non-inverted and inverted input signals being applied to said first and second column conductors, respectively, said AND plane means also including a plurality of third transistors, wherein a minterm is realized by connecting the controlled current path of said third transistor between said first row conductor and its associated common row conductors of the row corresponding to the minterm and having its gate connected to either said first column conductor or said second column conductor of one of said N columns;

OR plane means for summing the minterms and having M rows and P columns where P is also a positive integer, said first row conductor of each one of said M rows in said AND plane means extending into a corresponding one of said M rows of said OR plane means, each one of said N columns having first and second column conductors, said first column conductor providing an output signal corresponding to a sum of minterms, a fourth transistor having its controlled current path connected between said first column conductor and a source of operating potential, and a fifth transistor having its controlled current path connected between said second column conductor and the reference potential, said OR plane means also having a plurality of sixth transistors, wherein a minterm is added to a column by connecting the controlled current path of said sixth transistors between said first and second column conductors of said column, and having its gate connected to a row conductor of a corresponding minterm;

AND/OR plane means for connecting said AND plane means to said OR plane means; and a delay row connected to said AND and said AND/OR planes for generating a timing signal to enable said OR plane means, including:

first and second dummy row conductors;

a NOR gate having one input connected to said first dummy row conductor, another input connected to a conductor having a reset signal applied thereto, and the output coupled to the respective gates of the fourth and fifth transistors in each one of said P columns in said OR plane means;

a seventh transistor having its controlled current path connected between said first dummy row conductor and a source of operating potential, and with the controlled current path of said eighth transistor being connected between said second dummy row conductor and the reference potential, the respective gates of said seventh and eighth transistors being driven by the inverted first clock phase;

a number of capacitance regions formed in the substrate and doped opposite thereto being at least three times as great as the number of third transistors in that row of the AND plane having the most third transistors, two thirds of the capacitance regions being in contact with said first dummy row conductor and the remaining one third of said capacitance regions being in contact with said common dummy row conductor, each of said capacitance regions having the same capacitance as those third transistors whose source-drain paths are connected between the first and second row conductors, the maximum number of said capacitance regions being three times the number of rows N in said AND plane means; and an n-channel transistor lying outside of said AND plane having its drain-source path connected between said first and common dummy row conductors, and the gate of said n-channel transistor being connected to a source of operating potential.

* * * * *